(12) United States Patent
Hovis et al.

(10) Patent No.: US 7,645,645 B2
(45) Date of Patent: Jan. 12, 2010

(54) ELECTRICALLY PROGRAMMABLE FUSE STRUCTURES WITH TERMINAL PORTIONS RESIDING AT DIFFERENT HEIGHTS, AND METHODS OF FABRICATION THEREOF

(75) Inventors: William P. Hovis, Rochester, MN (US); Louis Lu-Chen Hsu, Fishkill, NY (US); Jack A. Mandelman, Flat Rock, NC (US); William R. Tonti, Essex Junction, VT (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 389 days.

(21) Appl. No.: 11/372,334

(22) Filed: Mar. 9, 2006

(65) Prior Publication Data

US 2007/0210411 A1    Sep. 13, 2007

(51) Int. Cl.
H01L 21/82 (2006.01)
(52) U.S. Cl. .............. 438/132; 257/209; 257/E23.149; 257/529
(58) Field of Classification Search ............ 257/529, 257/E23.149, 209; 438/132, 602
See application file for complete search history.

(56) References Cited

U.S. PATENT DOCUMENTS

| 4,198,744 | A |   | 4/1980  | Niclolay |           |
|-----------|---|---|---------|----------|-----------|
| 4,382,289 | A |   | 5/1983  | Saitoh   |           |
| 4,517,583 | A | * | 5/1985  | Uchida ..................... 257/67 |
| 4,536,948 | A |   | 8/1985  | Te Velde et al. ............... 29/577 |
| 4,630,355 | A | * | 12/1986 | Johnson ..................... 438/6 |
| 4,670,970 | A |   | 6/1987  | Bajor    |           |
| 4,747,076 | A |   | 5/1988  | Mukai    |           |
| 5,019,532 | A |   | 5/1991  | Kaya     |           |
| 5,420,456 | A |   | 5/1995  | Galbi et al. |       |
| 5,572,409 | A |   | 11/1996 | Nathan et al. |      |
| 5,618,750 | A | * | 4/1997  | Fukuhara et al. ............ 438/601 |
| 6,337,507 | B1 |  | 1/2002  | Bohr et al. ................ 257/529 |
| 6,512,284 | B2 |  | 1/2003  | Schulte et al. |    |
| 6,642,601 | B2 |  | 11/2003 | Marshall et al. ............ 257/529 |
| 6,661,330 | B1 |  | 12/2003 | Young ..................... 337/297 |
| 6,756,255 | B1 |  | 6/2004  | Thuruthiyil et al. ......... 438/132 |
| 6,879,018 | B2 |  | 4/2005  | Marr et al. ................. 257/529 |

(Continued)

FOREIGN PATENT DOCUMENTS

JP      60231350 A     11/1985

(Continued)

*Primary Examiner*—Leonardo Andújar
(74) *Attorney, Agent, or Firm*—Heslin Rothenberg Farley & Mesiti PC (57) ABSTRACT

Electrically programmable fuse structures for an integrated circuit and methods of fabrication thereof are presented, wherein the electrically programmable fuse has a first terminal portion and a second terminal portion interconnected by a fuse element. The first terminal portion and the second terminal portion reside at different heights relative to a supporting surface of the fuse structure, and the interconnecting fuse element transitions between the different heights of the first terminal portion and the second terminal portion. The first and second terminal portions are oriented parallel to the supporting surface, while the fuse element includes a portion oriented orthogonal to the supporting surface, and includes at least one right angle bend where transitioning from at least one of the first and second terminal portions to the orthogonal oriented portion of the fuse element.

10 Claims, 7 Drawing Sheets

U.S. PATENT DOCUMENTS

| | | |
|---|---|---|
| 6,960,978 B2 | 11/2005 | Leigh et al. |
| 7,288,804 B2 | 10/2007 | Booth, Jr. et al. |
| 2003/0209734 A1 | 11/2003 | Kothandaraman |
| 2004/0209404 A1 | 10/2004 | Wang et al. ............ 438/132 |
| 2005/0219932 A1 | 10/2005 | Diorio et al. |
| 2005/0285224 A1 | 12/2005 | Tsutsui |
| 2007/0247273 A1 | 10/2007 | Booth, Jr. et al. |

FOREIGN PATENT DOCUMENTS

| | | |
|---|---|---|
| JP | 63246844 A | 10/1988 |
| JP | 05120985 A | 5/1993 |

* cited by examiner fig. 1
(PRIOR ART)

fig. 2 fig. 3 fig. 4 fig. 5 fig. 6 fig. 7 fig. 8 fig. 9 fig. 10 fig. 11 fig. 12A fig. 12B fig. 13 fig. 14 fig. 15 fig. 16A fig. 16B fig. 17

ELECTRICALLY PROGRAMMABLE FUSE STRUCTURES WITH TERMINAL PORTIONS RESIDING AT DIFFERENT HEIGHTS, AND METHODS OF FABRICATION THEREOF

CROSS-REFERENCE TO RELATED APPLICATIONS

This application contains subject matter which related to the subject matter of the following co-filed, commonly assigned applications, each of which is hereby incorporated herein by reference in its entirety:

"Electronic Fuse with Conformal Fuse Element Formed Over a Freestanding Dielectric Spacer", by Hsu et al., U.S. Ser. No. 11/372,387, co-filed herewith;

"Electrically Programmable π-Shaped Fuse Structures and Methods of Fabrication Thereof", by Booth et al., U.S. Ser. No. 11/372,380, co-filed herewith; and "Electrically Programmable Fuse Structures with Narrowed Width Regions Configured to Enhance Current Crowding and Methods of Fabrication Thereof", by Booth et al., U.S. Ser. No. 11/372,386, co-filed herewith;

TECHNICAL FIELD

The present invention relates in general to semiconductor structures and methods of fabrication thereof, and more particularly, to fuses and methods of fabrication thereof, which employ a fuse element that is electrically programmable utilizing today's integrated circuit operating voltages.

BACKGROUND OF THE INVENTION

Historically, repair of dynamic random access memory (DRAM) arrays is achieved by replacing defective word-lines or bit-lines with redundant word-lines or bit-lines, using a laser to open circuit fuses made of a conductive material. As devices continue to shrink, the relative size of these laser fuses is limited by the wavelength of the laser employed. Therefore, the size of the laser fuse cannot be shrunk indefinitely. Thus, ablative laser-blown fuses become more difficult to implement due to the silicon space required to implement the fuses and avoid damage to neighboring circuits. Further, repairing an integrated circuit chip by open circuiting thousands of laser programmable fuses is a time consuming process.

An alternative fuse approach is to implement an electrically programmable fuse. One-time electrically programmable fuses, referred to as e-fuses, have become popular recently due to the circuit and system design flexibility which they provide. For example, an e-fuse can be programmed even after the integrated circuit chip has been packaged and installed in the system (unlike the laser fuse approach). For instance, a customer can tailor a circuit design to the specific needs of the application after the circuit is installed in the field. An e-fuse also provides freedom to alter a circuit design, or fix a problem that may occur during the life of the product. Electrically programmable fuses are much smaller than ablative-type fuses, resulting in circuit density advantages. Although electrically programmable e-fuses provide these noted benefits, integration with standard CMOS processing has been problematic. Furthermore, obtaining a tight distribution of open circuiting voltages derived using today's normal operating voltages continues to be challenging. Existing e-fuses today typically require voltages in excess of normal supply voltages for programming. As operating voltages continue to be aggressively scaled down with each succeeding generation of integrated circuit technology, obtaining sufficiently high voltages for programming an e-fuse can tax the electrical operating limits of the technology, and increase circuit complexity, for example, due to the need for charge pumps.

In view of this, there remains a need in the art for enhanced electrically programmable fuses, and methods of fabrication thereof, which may be readily programmed with today's on-chip operating voltages, and be readily integrated with standard semiconductor circuit fabrication processing.

SUMMARY OF THE INVENTION

Briefly summarized, the present invention comprises in one aspect a fuse for an integrated circuit. The fuse includes a first terminal portion and a second terminal portion interconnected by a fuse element. The first terminal portion and the second terminal portion reside at different heights relative to a supporting surface, and the interconnecting fuse element transitions between the different heights of the first terminal portion and the second terminal portion.

In further aspects, the first terminal portion and the second terminal portion are each oriented parallel to the supporting surface, and the fuse element includes a portion oriented orthogonal to the supporting surface. The fuse element further includes at least one right angle bend extending from at least one of the first terminal portion and the second terminal portion to the orthogonal oriented portion of the fuse element. In one aspect, thickness of the fuse can vary, with a thickness of the fuse element being less than a thickness of the first terminal portion and a thickness of the second terminal portion. In another aspect, the supporting surface is a surface of a supporting semiconductor substrate, with the first terminal portion being disposed at least partially within a diffusion of the supporting semiconductor substrate, and the second terminal portion disposed at least partially in a polysilicon stack extending above the supporting semiconductor substrate, and wherein the first terminal portion, second terminal portion and fuse element are silicide.

In other embodiments, a sidewall spacer is provided over a sidewall of the polysilicon stack with the portion of the fuse element disposed over the sidewall spacer having a thickness less than a thickness of the first terminal portion and a thickness of the second terminal portion. Further, in one embodiment, the first terminal portion resides at the supporting surface, and the second terminal portion resides at a height H above the supporting surface, wherein the second terminal portion resides on a dielectric material. Yet further, the supporting surface may comprise a surface of a supporting semiconductor substrate, with the first terminal portion disposed at least partially within a diffusion in the semiconductor substrate, and the fuse element terminating over the first terminal portion and having a bridge region of reduced width compared with the width of the balance of the fuse element. This bridge of reduced width may either be rectangular-shaped or triangular-shaped in plan view, and approximate a point, thereby enhancing programmability of the fuse over the first terminal portion and adjacent to a right angle bend in the fuse element from the first terminal portion to the portion of the fuse element oriented orthogonal to the supporting surface.

In still another aspect, a method of fabricating a fuse for an integrated circuit is provided. The method includes: providing a supporting surface with a support structure disposed over the supporting surface; forming a fuse extending between the supporting surface and an upper surface of the support structure, the fuse including a first terminal portion and a second terminal portion interconnected by a fuse element, wherein the first terminal portion resides at the supporting surface, the second terminal portion resides at the upper surface of the support structure, and the interconnecting fuse element transitions between the first terminal portion and the second terminal portion disposed at different heights relative to the supporting surface.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Typically, the resistance of programmed prior art polycide e-fuses is highly variable. Variations in the electrical characteristics of the driver transistors due, for example, to threshold voltage (Vt) variations and line width variations are commonly encountered. This results in variations in programming current, which in turn causes the length of the opened gap (electromigration length of the silicide) in the fuse element to vary. Since read current is traditionally forced through the silicon underlying the blown fuse element, the overall resistance of the programmed fuse will also vary. This dependence of the programmed resistance on the electromigration length of the silicide can lead to difficulties in correctly sensing the state of a programmed e-fuse.

In addition, recently developed e-fuse structures take advantage of electro-migration (EM) effects to address certain of the above-noted problems of achieving scaling of programming voltage. The EM effect, caused by a positive divergence of the ionic flux, leads to an accumulation of vacancies, forming voids in the metal. Voids are formed inside of the metal conductors due to metal ion movement caused by momentum transfer from the electron flux at high current density. The void growth rate is a function of current density, and therefore, the site having the smallest cross-sectional area in an interconnect tends to form voids first. It is advantageous to somehow increase the local current density in predefined regions of the fuse element, and/or to increase the thermal resistance surrounding the fuse element, thus providing a means to improve programming efficiency.

Figure 1:
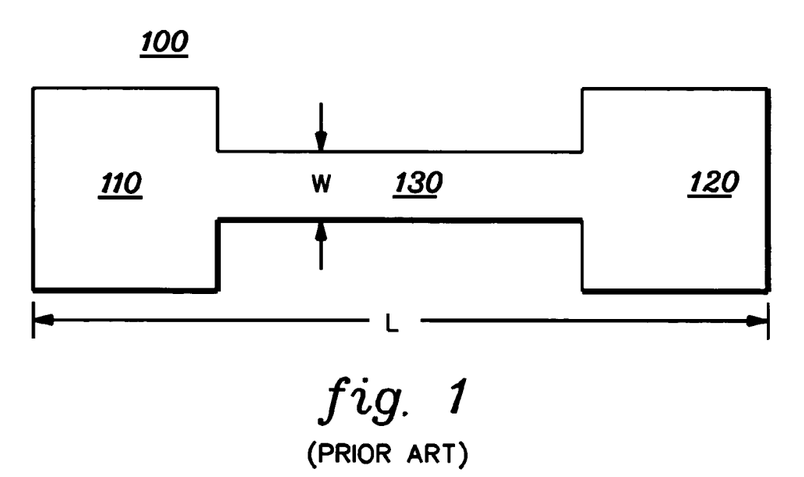
FIG. 1 is a plan view of one embodiment of a prior art two-dimensional "dog-bone" shaped electrically programmable fuse.

One approach to increasing local current density is depicted in FIG. 1, wherein the plan view layout of the illustrated electronic fuse 100 is a two-dimensional "dog-bone" shape. Fuse 100, which employs in-plane dimensional differences to locate an open circuit site via a localized high electron/current flow, includes a large cathode pad 110 and a large anode pad 120, between which a small cross-section interconnect 130 is disposed. Electrical contacts (not shown) are separately made to cathode pad 110 and anode pad 120. This configuration has been adopted in the semiconductor industry as a basic e-fuse design. Although this e-fuse design alleviates some of the above-noted problems of scaling, size and programming energy requirements, there is still a need for further progress in these areas to meet requirements below the 65 nm technology level. By way of example, with current 65 run back end of line (BEOL) technology, the electrically programmable fuse 100 illustrated in FIG. 1 might have an interconnect 130 width W greater than 90 nm, and an overall length L greater than 800 nm. Thus, programming efficiency of this fuse implementation is limited by width W, which depends on available lithography resolution, and technology extendibility is restricted by the overall length L of the fuse.

Generally stated, provided herein is an improved electrically programmable fuse structure, which advantageously takes advantage of existing topologies, integrates well with standard processing, is scalable with technology levels, is compact and provides a degree of freedom wherein absolute programming power can be scaled with existing integrated circuit supplies. In one embodiment, the fuse presented has a first terminal portion, second terminal portion and a fuse element, which interconnects the first terminal portion and second terminal portion. The first terminal portion and second terminal portion reside at different heights relative to a supporting surface, such as a supporting substrate, and the interconnecting fuse element transitions between the different heights of the first terminal portion and the second terminal portion. More particularly, the first terminal portion and the second terminal portion are each oriented parallel to the supporting surface, and the fuse element includes a portion that is oriented orthogonal to the supporting surface. The fuse element undergoes, in various embodiments, at least one right angle bend where transitioning from the first terminal portion or the second terminal portion to the fuse element portion oriented orthogonal to the supporting surface. Thus, in elevational cross-section taken through the fuse element, the fuse structure is two-dimensional, having both horizontal and vertical components. Although the first terminal portion and the second terminal portion may interchangeably comprise the cathode and anode pads, the embodiments described herein assume that the first terminal portion is the cathode pad, while the second terminal portion is the anode pad.

Various embodiments of fuse structures and methods of fabrication thereof (in accordance with aspects of the present invention) are described below with reference to FIGS. 2-17. In the embodiments presented, it is assumed that the fuse structure is an electrically programmable fuse structure having a "dog-bone" or "H" shape in plan view.

Figure 2:
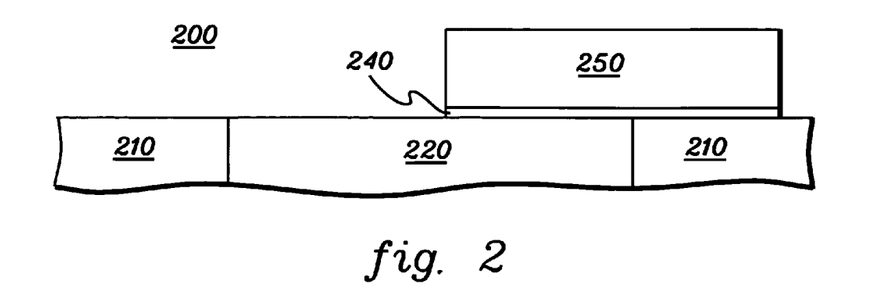
FIG. 2 is a cross-sectional elevational view of an intermediate structure obtained during a fuse fabrication approach, in accordance with an aspect of the present invention.
Figure 3:
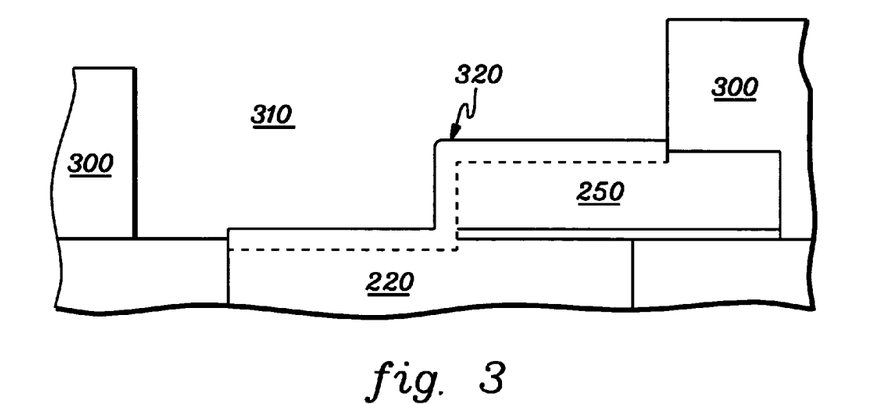
FIG. 3 is a cross-sectional elevational view of the intermediate structure of FIG. 2 after provision of a silicide mask and formation of silicide to define the fuse structure, in accordance with an aspect of the present invention.
Figure 4:
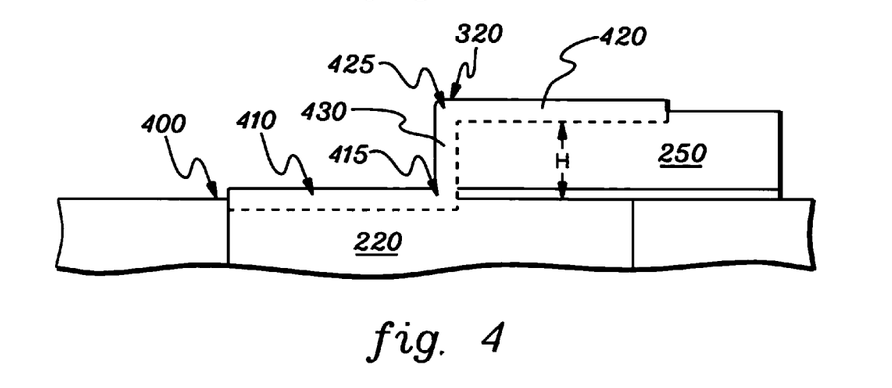
FIG. 4 is a cross-sectional elevational view of the structure of FIG. 3 after removal of the silicide mask, in accordance with an aspect of the present invention.

A first fuse structure and fabrication thereof are depicted with reference to the cross-sectional elevational views of FIGS. 2-4. As shown in the intermediate structure 200 of FIG. 2, conventional processing is employed to define an insulated region 210 in a semiconductor substrate 220, such as a silicon substrate. Region 210 may have any desired configuration, such as a rectangular shape, and may comprise a walled, shallow-trench isolation region (STI) within which one or more electronic devices (not shown) are to be fabricated using conventional processing. Following standard well implants, a gate dielectric 240 (such as gate oxide) is formed, and a gate conductor polysilicon 250 is deposited and patterned as shown in FIG. 2 to define a gate or polysilicon stack extending partially over the silicon active area 220 whithin region 210.

As shown in FIG. 3, a layer of dielectric, such as photoresist or polyimide, is applied and patterned as a silicide block mask 300, leaving exposed 310 the fuse structure region, including polysilicon 250 of the gate stack and the underlying silicon substrate 220. A layer of metal is then conformally deposited, for example, by chemical vapor deposition (CVD) over the device region. The metal may comprise one of nickel, cobalt, tungsten, titanium, tantalum, or other metal capable of reacting with silicon to form a low resistivity, thermally stable silicide. The substrate is annealed to react the metal with the silicon to form a silicide layer 320. Metal in contact with insulating material such as the STI region 210 or mask 300 does not react, and is subsequently removed with a selective etch, leaving the silicided fuse structure 320. As shown in FIG. 3, the silicide forms at least partially within the polysilicon layer 250 and partially within the silicon substrate 220. In practice, the thickness of gate dielectric 240 is much less than the thickness of silicide layer 320, and thus continuous silicide forms on the corner of polysilicon 250, gate dielectric 240 and substrate 220.

FIG. 4 depicts the structure of FIG. 3 after removal of the silicide mask. As shown, fuse structure 320 includes a first terminal portion 410 and a second terminal portion 420 interconnected by a fuse element 430. In this embodiment, first terminal portion 410 is oriented parallel with a supporting surface 400 of substrate 220, as is second terminal portion 420. However, second terminal portion 420 is spaced above supporting surface 400 by a height "H" equal to the gate dielectric and the polysilicon stack 250, less the depth of silicide formation within the polysilicon from the exposed upper surface of the polysilicon. The electrically programmable fuse 320 includes a fuse element with two right angle bends, one bend 415 is adjacent to first terminal portion 410, while the other bend 425 is adjacent to the second terminal portion 420. Advantageously, these bends 415, 425 in the fuse element result in regions of enhanced current density, heat generation and temperature rise within the fuse element with application of a programming voltage across the first terminal portion and second terminal portion.

To summarize, fabrication of the fuse structure depicted in FIGS. 2-4 includes termination of a patterned polysilicon stack over the active substrate area, and the formation of silicide over the active silicon area and over the polysilicon gate stack, resulting in a fuse element or link forming between the two terminal portions. This fuse element is readily programmable under DC current flow. The patterned polysilicon layer and/or the active silicon region may be of minimum dimension for a given technology level. Although not shown, the programming delivery system could include separate electrical contacts to the first terminal portion and the second terminal portion. (By way of example, reference FIG. 12A described below.)

Advantageously, this fuse structure integrates directly with standard semiconductor processing, and is compact, and scales dimensionally with lithography levels. Programming is bi-directional, and the cathode and anode terminals (i.e., the first terminal portion and the second terminal portion) are interchangeable.

Those skilled in the art should further note that the fabrication processes described herein are provided by way of example only. Variations to one or more aspects of the fabrication processes can be employed without departing from the spirit of the present invention. For example, the electrically programmable fuse structure and fabrication process may employ other substrates, such as silicon-on-insulator (SOI), and in certain embodiments described below, non-semiconductor substrates.

Figure 5:
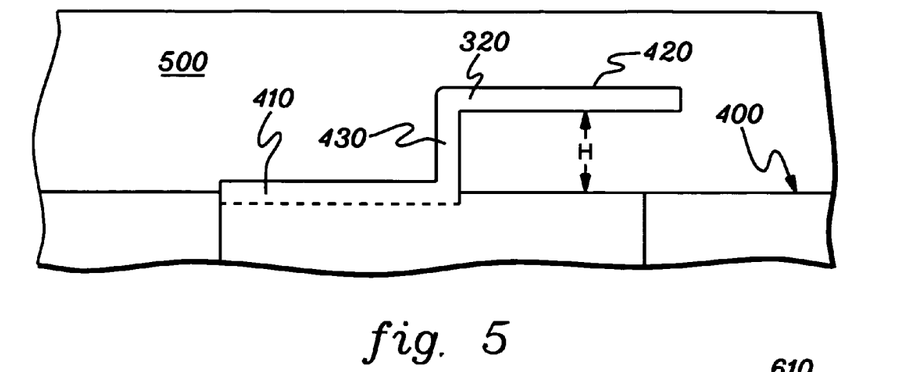
FIG. 5 is a cross-sectional elevational view of the fuse structure of FIG. 4 after removal of the gate stack and partial surrounding of the fuse structure with a dielectric material, in accordance with an aspect of the present invention.

FIG. 5 depicts an alternate embodiment of a fuse structure in accordance with an aspect of the present invention. This alternate embodiment is fabricated from the structure of FIG. 4 by forming a dielectric layer 500 (e.g., an inter-level dielectric) surrounding fuse element 430 and second terminal portion 420 of the fuse structure 320. Layer 500 is formed, for example, by etching polysilicon 250 of FIG. 4 and backfilling with dielectric material to fill the void created by the etched polysilicon, or alternatively, by oxidizing polysilicon 250 from exposed surfaces after removal of the silicide mask of FIG. 3.

This fuse structure of FIG. 5 advantageously results in an increased thermal resistance to the substrate during programming, thus reducing required programming energy. In this embodiment, programming is more likely to occur at the fuse element right angle bend adjacent to the second terminal portion encapsulated in the dielectric. Again, the electrically programmable fuse structure is compact, and scales dimensionally with lithography levels.

Figure 6:
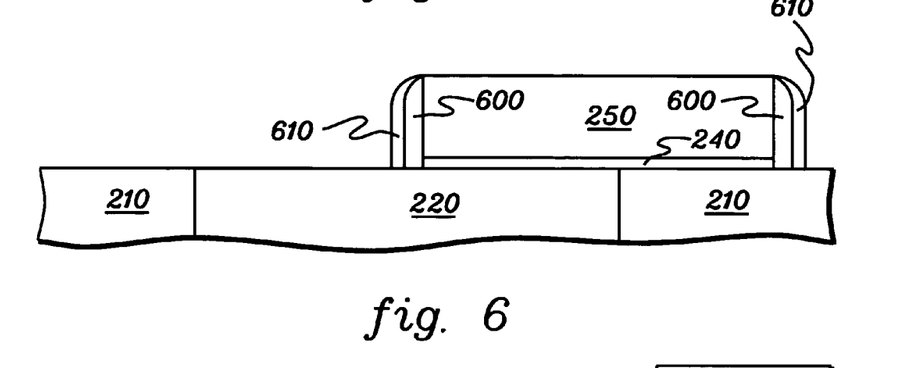
FIG. 6 is a cross-sectional elevational view of an intermediate structure obtained during a further fuse fabrication approach, in accordance with an aspect of the present invention.
Figure 7:
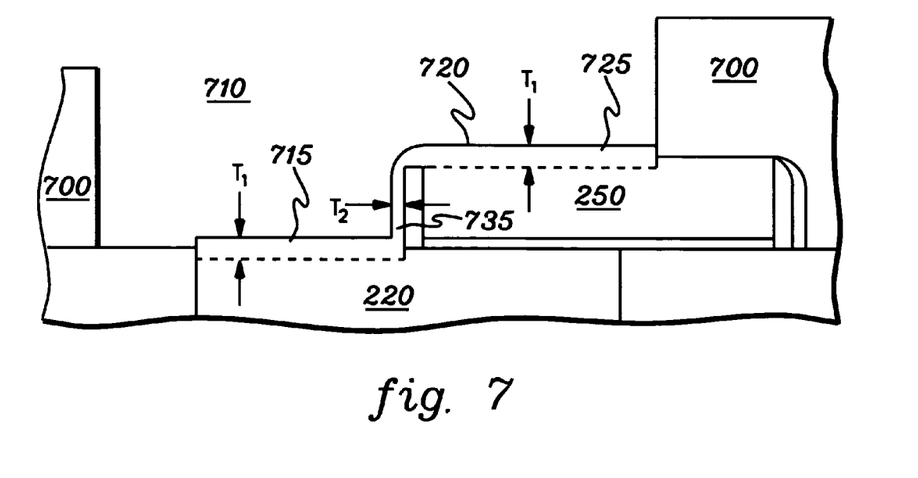
FIG. 7 is a cross-sectional elevational view of the intermediate structure of FIG. 6 after provision of a silicide mask and formation of silicide to define the fuse structure, in accordance with an aspect of the present invention.

FIGS. 6 & 7 depict another fuse structure and fabrication approach, in accordance with an aspect of the present invention. In this approach, standard insulating spacers 600 are added to the sidewall of the gate stack shown in FIG. 2 comprising polysilicon 250 and gate dielectric 240. Next, a thin polysilicon conductor spacer 610 is formed over the insulating sidewall spacer 600. This thin polysilicon spacer provides independent control of the thickness of the fuse element, thereby allowing control within a standard silicide growth of programming power required to open circuit the fuse element. This approach thus provides both technology scaling and power supply scaling so that the electrically programmable fuse structure can be more readily programmed in any package. It is significant to note that multiple polysilicon sidewall spacers can be formed, each with different thickness, thereby providing various degrees of programmability within an integrated circuit chip. For example, one fuse element may comprise a thick spacer/silicide sidewall combination for the sole purpose of determining tampering (i.e., with an intent to never program the electrical fuse), or for use as an event identifier (i.e., system overpower bit). Further, it should be noted that the thickness of polysilicon spacer 610 and the thickness of insulating spacer 600 are independent.

The fuse structure is completed as shown in FIG. 7 by provision of a silicide mask 700, defining fuse opening 710, which is followed by deposition of one of nickel, cobalt, tungsten, titanium, tantalum, or other metal capable of reacting with silicon to form a low resistivity, thermally stable silicide. The intermediate structure is annealed to react the metal with the silicon to form the fuse structure 720, which in this embodiment, includes a first terminal portion 715, a second terminal portion 725 and an interconnecting fuse element 735 formed from the polysilicon sidewall spacer 610 of FIG. 6. Also, note that in this embodiment the thickness $T_1$ of the first terminal portion and second terminal portion is greater than the thickness of the interconnecting fuse element $T_2$. This is because of the greater supply of silicon available in silicon substrate 220 and polysilicon stack 250 during the annealing to form the silicide layer defining fuse structure 720.

Advantageously, the structure of FIG. 7 allows for enhanced control of the silicide thickness in the fuse element region, thereby allowing for adjustability of the programming energy required to program the fuse structure. As with the other embodiments, the electrically programmable fuse is compact, and scales dimensionally with lithography levels.

Figure 8:
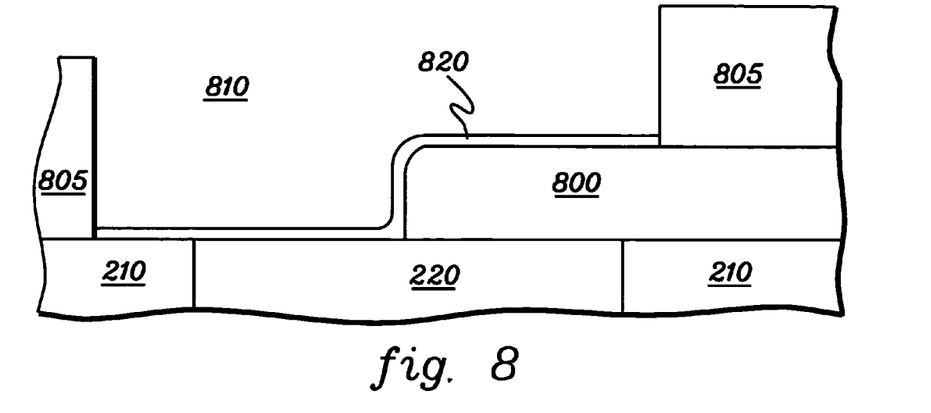
FIG. 8 is a cross-sectional elevational view of an intermediate structure obtained during another fuse fabrication approach, wherein a thin polysilicon layer resides partially over a patterned insulator, in accordance with an aspect of the present invention.
Figure 9:
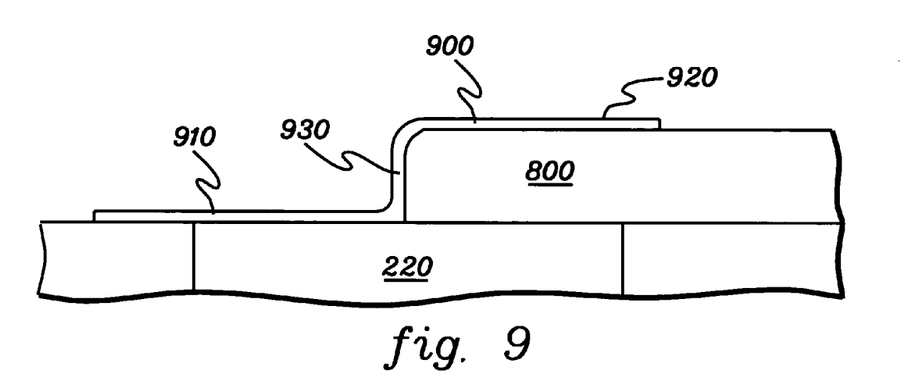
FIG. 9 is a cross-sectional elevational view of the structure of FIG. 8 subsequent to siliciding of the polysilicon layer to define the fuse structure, in accordance with an aspect of the present invention.

As a variation on the fuse structure of FIG. 7, an intermediate structure such as depicted in FIG. 8 could be employed wherein the silicon substrate 220 within the isolation region 210 has disposed partially above it a patterned insulator 800. A mask 805 with an opening 810 is provided within which the fuse structure is to be defined. A thin polysilicon conductor 820 is separately deposited over the patterned insulator 800 and the supporting surface of the substrate as shown in FIG. 8. This polysilicon layer is then converted to a silicided electrically programmable fuse structure 900 as shown in FIG. 9 by the application of an appropriate metal and annealing of the substrate to react the metal to the polysilicon as described above. The resultant fuse structure 900 is depicted in FIG. 9, wherein a first terminal portion 910 resides atop the supporting surface comprising a surface of substrate 220 and a second terminal portion 920 resides above the patterned insulator 800, with the fuse element 930 being a sidewall spacer on the insulator that interconnects the first terminal portion and the second terminal portion.

Advantageously, this embodiment increases thermal resistance by the provision of dielectric 800 underneath the second terminal portion 920 and adjacent to the fuse element 930. This increased thermal resistance adjacent to these structures reduces the programming energy required to open circuit the fuse element. Further, the thickness of the silicide is controlled by selection of the thickness of the polysilicon, thereby allowing the programming energy needed to open circuit the fuse element to be controlled, or (in one embodiment) minimized. The electrically programmable fuse structure of FIG. 9 is again compact, and scales dimensionally with lithography levels.

Figure 10:
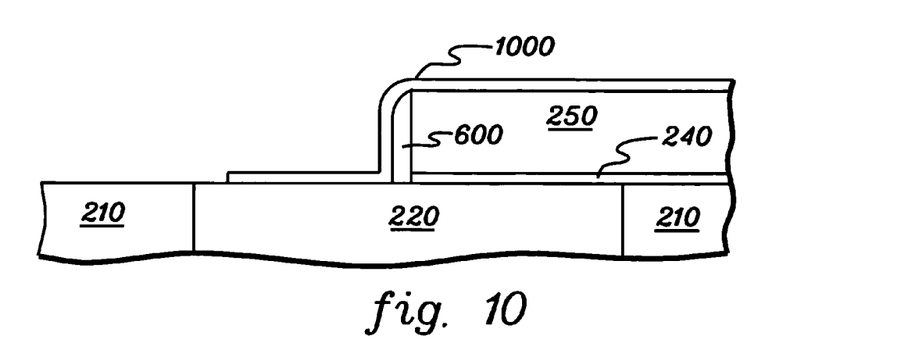
FIG. 10 is a cross-sectional elevational view of an intermediate structure obtained during a further fuse fabrication approach wherein a thin polysilicon layer is disposed at least partially over a standard insulating sidewall spacer of a gate stack, in accordance with an aspect of the present invention.
Figure 11:
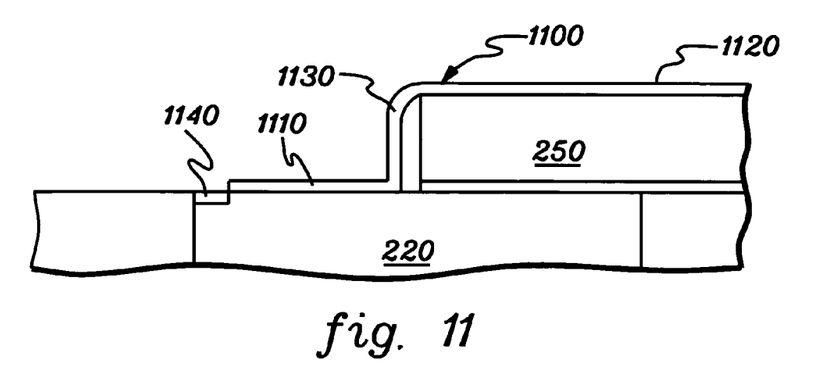
FIG. 11 is a cross-sectional elevational view of the structure of FIG. 10 after siliciding of the polysilicon to define the fuse structure, in accordance with an aspect of the present invention.

FIGS. 10 & 11 depict a further alternate embodiment of the structure of FIG. 7, which again includes a gate stack comprising polysilicon 250 over gate oxide 240 extending above a surface of a silicon substrate 220 having an active area defined within a shallow-trench isolation region 210. A standard insulating sidewall spacer 600 resides on a sidewall of the gate stack. In FIG. 10, a thin polysilicon layer 1000 has been deposited and patterned to reside over substrate 220, sidewall spacer 600 and polysilicon 250 as shown. This step is similar to the formation of the polysilicon layer 820 in FIG. 8. A layer of metal is then conformally deposited over the polysilicon 1000 (and exposed silicon substrate 220), and the substrate is annealed to react the metal with the silicon and form a silicide layer 1100 as shown in FIG. 11. The resultant electrically programmable fuse structure includes a first terminal portion 1110 over substrate 220 and a second terminal portion 1120 over polysilicon stack 250, which are interconnected by a fuse element 1130. The silicide 1140 in the exposed silicon substrate 220 is an artifact of the process and does not effect programmability of the fuse structure. In practice, silicide 1100 over polysilicon 250 and silicon substrate 220 may extend somewhat into the polysilicon 250 and substrate 220. Silicide thickness of fuse element 1130 is thus thinner than the silicide thickness in first terminal portion 1110 or second terminal portion 1120.

Advantageously, this embodiment of the fuse structure again includes a silicide thickness over the sidewall spacer that is controlled, thereby allowing for control (e.g., minimization) of the programming energy required to program the fuse structure. The electrically programmable fuse is again compact, and scales dimensionally with lithography levels.

Figure 12A:
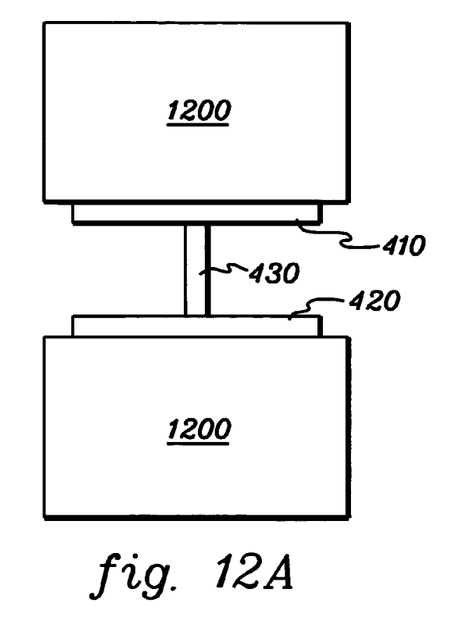
FIG. 12A is a plan view of one embodiment of the fuse structure of FIG. 4 showing electrical contacts made to the first terminal portion and the second terminal portion of the fuse structure, in accordance with an aspect of the present invention.
Figure 12B:
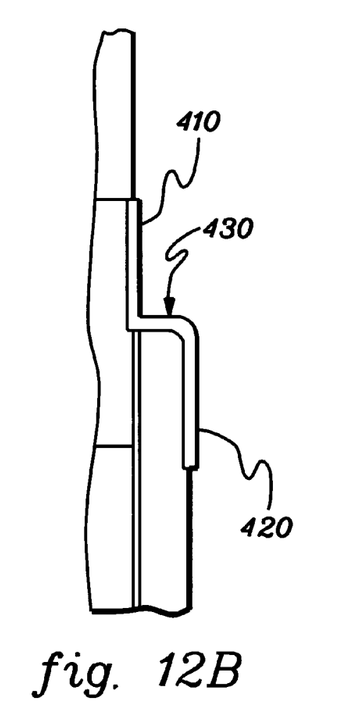
FIG. 12B is a cross-sectional elevational view of the fuse structure of FIG. 12A showing the fuse element transitioning between the first terminal portion and the second terminal portion, in accordance with an aspect of the present invention.

FIGS. 12A & 12B depict the fuse structure of FIG. 4 in plan and elevational cross-section, respectively. In the plan view of FIG. 12A, the fuse structure 320 is again shown to include first terminal portion 410 and second terminal portion 420 interconnected by fuse element 430. As noted above, terminal portions 410, 420 reside at different heights within the structure, and fuse element 430 transitions between the different heights, preferably including one or more right angle bends in the transition as illustrated in FIG. 12B. Electrical contacts 1200 are provided in FIG. 12A to contact the terminal portions and provide a programming current to the electrically programmable fuse. Note that the length of fuse element 430 depicted in plan view FIG. 12A is expanded somewhat for clarity compared with FIG. 12B.

As a further enhancement, the interface between the fuse element and, for example, the terminal portion formed within a diffusion of the substrate is specially configured to enhance current crowding in the fuse element adjacent to the interface between the fuse element and the terminal portion. By promoting current crowding, joule heating is increased in this portion of the fuse element, and thus programmability of the fuse element is enhanced. This enhancement means that the programming power is reduced (i.e., voltage and current required is reduced), and also that the final programmed resistance across the open circuited fuse element is increased.

Figure 13:
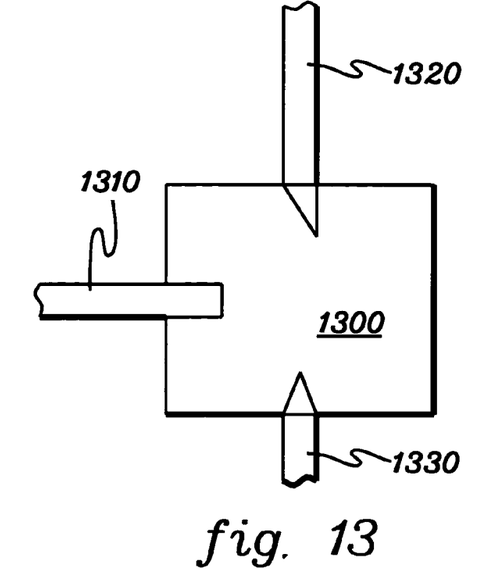
FIG. 13 is a plan view of various embodiments for terminating a polysilicon line (to be subsequently silicided and define the fuse element) over a diffusion region (within which the first terminal portion of the fuse is to be subsequently defined), in accordance with an aspect of the present invention.

Referring to FIG. 13, a diffusion area 1300 in a substrate is shown within which a first terminal portion is to be subsequently defined. In this embodiment, multiple polysilicon lines 1310, 1320 & 1330 are illustrated terminating over diffusion 1300. Line 1310 has a conventional square-shaped polysilicon line termination, while lines 1320 & 1330 terminate in triangular-shaped bridge patterns over the diffusion 1300. These polysilicon line bridges provide an assist to the programmability of the resultant fuse structure at the fuse element/first terminal portion interface (i.e., with the first terminal portion being subsequently defined in the diffusion region, and the fuse element defined in the polysilicon line via, e.g., siliciding of the silicon as described above). This interface is disposed, for example, at the location in the fuse where the fuse element undergoes a right angle bend and extends vertically upwards from the first terminal portion (oriented parallel with the supporting surface). The approximate triangular-shaped bridge termination of the polysilicon line over the diffusion results in a silicide fuse with a single point of contact via a silicided fuse element to diffusion terminal portion bridge. Triangular-shaped bridge termination of the polysilicon line can be achieved by applying a photoresist mask to block the majority of the polysilicon line, except the portion of line extending over the diffusion region. A reactive ion etching or a wet etch may then be utilized to trim the line over the diffusion region and achieve the triangular-shaped bridge. A goal in forming the bridge at the terminal of the polysilicon line is to reduce the interface between the polysilicon line and the diffusion region to as small a size as possible, for example, to a point. This reduced bridge area will then enhance heating of the fuse element at the interface and thus open circuiting of the fuse when undergoing programming.

Figure 14:
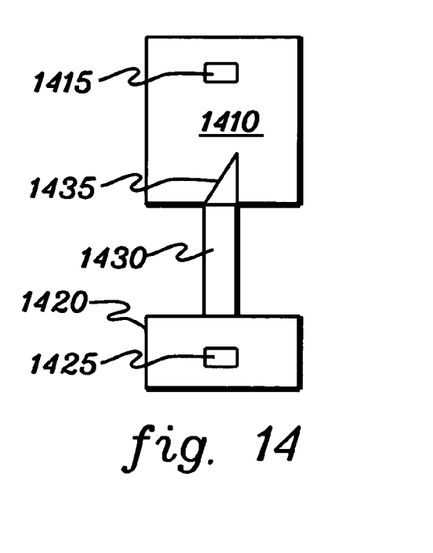
FIG. 14 is a plan view of one embodiment of a fuse structure employing a triangular-shaped bridge structure at termination of the fuse element over the first terminal portion (which is assumed to be defined in a diffusion region of the supporting semiconductor substrate), in accordance with an aspect of the present invention.

FIG. 14 is a plan view of one embodiment of a fuse structure employing the pointed bridge concept of FIG. 13. Specifically, a first terminal portion 1410 is shown connected to a second terminal portion 1420 via a fuse element 1430. Terminal portion 1410 is assumed to be formed in a diffusion and a bridge interface 1435 having a triangular shape in plan view is provided at the terminating end of fuse element 1430 over the first terminal portion 1410. Electrical contacts 1415 and 1425 are also shown to the first terminal portion 1410 and second terminal portion 1420, respectively. By providing the triangular-shaped termination bridge at the termination of the fuse element over the first terminal portion, enhanced current crowding is achieved in that region, which as noted above, is adjacent to the right-angle bend in the fuse element from the horizontally disposed first terminal portion to the vertically oriented portion of the fuse element.

Figure 15:
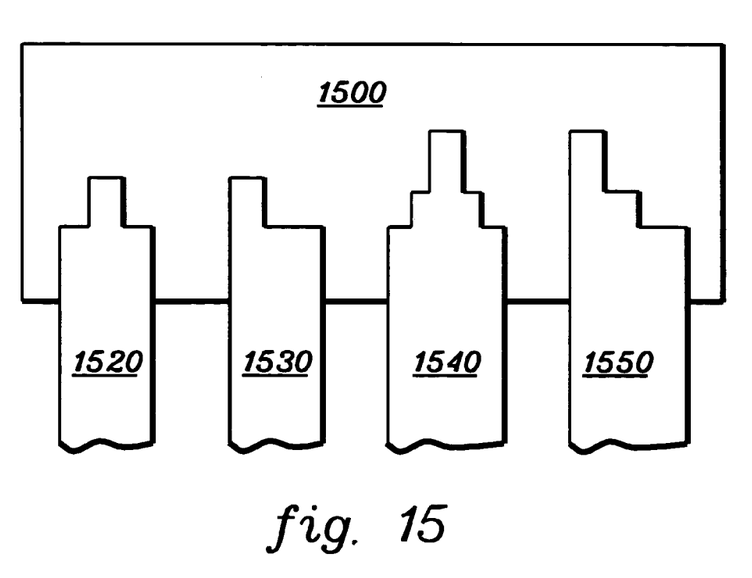
FIG. 15 depicts various approaches for terminating a fuse element over a terminal portion defined in a diffusion region, wherein masking and etching can be employed to define various-shaped bridges between the fuse element and the diffusion region, in accordance with an aspect of the present invention.

FIG. 15 depicts various fuse element to terminal portion bridges defined using processing-friendly, rectangular bridge shapes only. In this view, first terminal portion 1500 is assumed to be formed in a diffusion, while the illustrated fuse element portions 1520, 1530, 1540 & 1550 comprise examples of silicided polysilicon lines which extend between the first terminal portion and a second terminal portion. The illustrated bridge shapes do not require patterning and etching to define the bridge termination, and are therefore more readily fabricated that the triangular bridges illustrated in FIGS. 13 & 14. Note that in each example, the bridge has a reduced line width compared with the width of the balance of the fuse element.

Figure 16A:
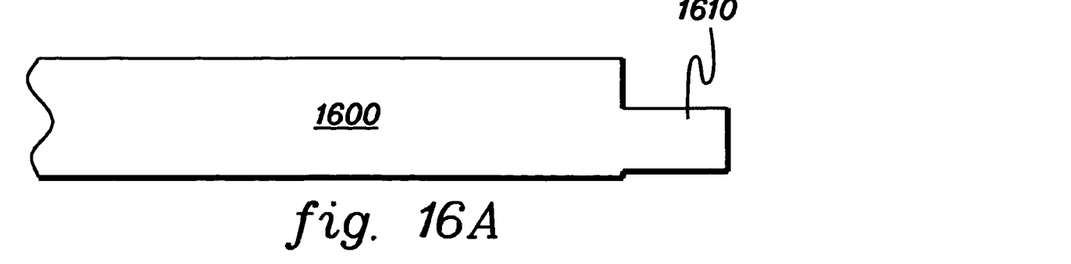
FIG. 16A depicts one gate level layout of a fuse element termination and bridge, in accordance with an aspect of the present invention.
Figure 16B:
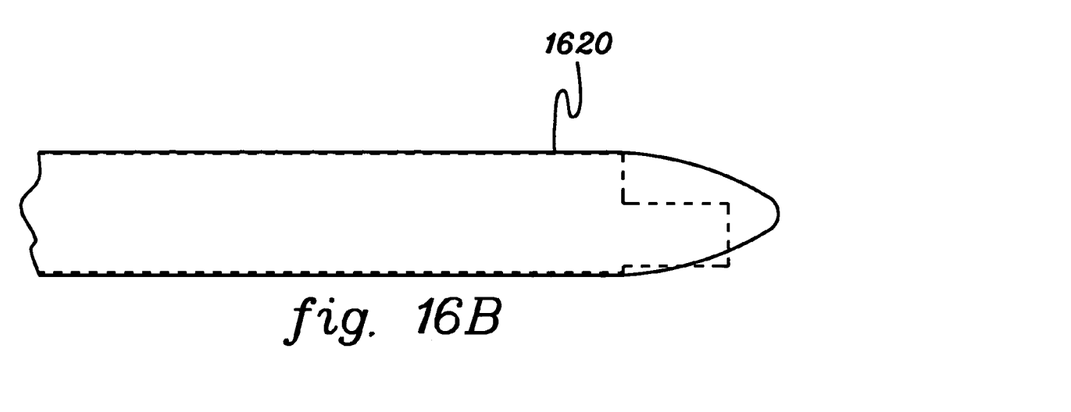
FIG. 16B depicts the corresponding approximate physical image resulting from the gate level layout of FIG. 16A, in accordance with an aspect of the present invention.

FIGS. 16A & 16B illustrate, by way of example, one fuse element 1600 having an orthogonal bridge 1610 which is to extend over the first terminal portion (not shown) formed within the diffusion. As shown in the rough physical image layout 1620 of FIG. 16B, the bridge layout image roughly defines a point, which again facilitates programmability of the fuse structure as described above. It should be noted that the pointed bridge layout image could be provided over the first terminal portion or the second terminal portion, or at both ends over the terminal portions.

Figure 17:
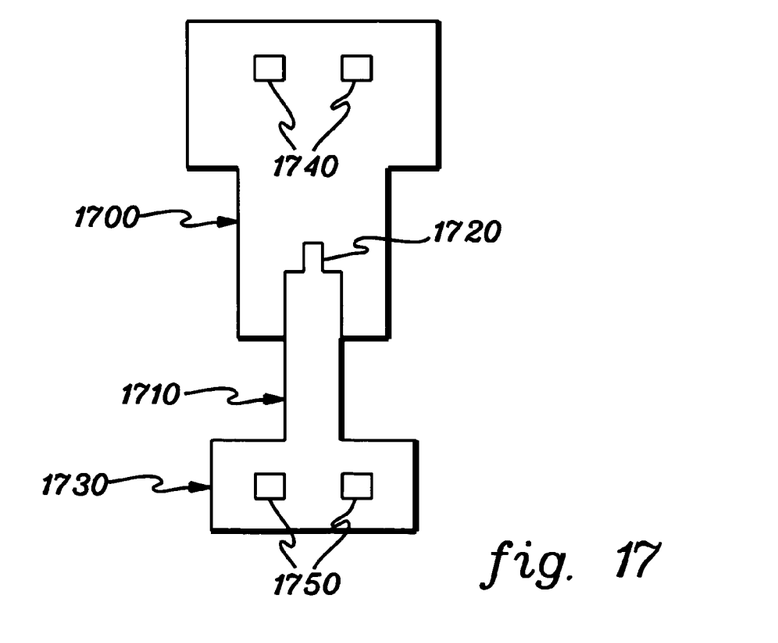
FIG. 17 depicts one embodiment of a fuse design/layout structure employing a fuse element with a bridge between the fuse element and the diffusion region within which the first terminal portion is to be defined, in accordance with an aspect of the present invention.

FIG. 17 depicts a plan view of a further embodiment of a fuse layout structure employing a pointed silicide bridge between the fuse element and the first terminal portion formed within the diffusion. In this example, the first terminal portion 1700 formed within the diffusion partially underlies the fuse element 1710, which interconnects the first terminal portion 1700 and a second terminal portion 1730. Electrical contacts 1740 & 1750 are made to first terminal portion 1700 & 1730, respectively. A rectangular-shaped bridge 1720 is employed as a reduced silicide area or point interconnecting the first terminal portion and fuse element.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of fabricating a fuse for an integrated circuit, the method comprising:
   providing a supporting surface with a support structure disposed over the supporting surface;
   forming a fuse extending between the supporting surface and an upper surface of the support structure, the fuse comprising a first terminal portion and a second terminal portion interconnected by a fuse element;
   wherein the first terminal portion resides at the supporting surface and the second terminal portion resides at the upper surface of the support structure, and wherein the interconnecting fuse element transitions between the first terminal portion and the second terminal portion disposed at different heights relative to the supporting surface; and
   wherein forming the fuse comprises forming the first terminal portion and the second terminal portion to be oriented parallel to the supporting surface, and the fuse element to include a portion oriented orthogonal to the supporting surface, wherein the fuse element further includes at least one right angle bend where transitioning from at least one of the first terminal portion and the second terminal portion to the orthogonal oriented portion of the fuse element, wherein the at least one right angle bend in the fuse element facilitates programming of the fuse by enhancing current density within the fuse element with application of a programming voltage across the first terminal portion and the second terminal portion.

2. The method of claim 1, wherein the support structure comprises a patterned insulator residing over the supporting surface, and wherein forming the fuse comprises forming the first terminal portion over the supporting surface, and the second terminal portion over the patterned insulator, with the fuse element transitioning between the first terminal portion and the second terminal portion by extending up a sidewall of the patterned insulator, and wherein the sidewall of the patterned insulator is orthogonal to the supporting surface.

3. The method of claim 2, wherein forming the fuse further comprises patterning a polysilicon layer over the supporting surface and the support structure, and siliciding the patterned polysilicon layer to define the fuse.

4. The method of claim 1, wherein the supporting surface comprises a surface of a supporting semiconductor substrate having a diffusion region, and wherein forming the fuse comprises forming the first terminal portion at least partially within the diffusion of the supporting semiconductor substrate, and forming the fuse element to include a bridge at an end of the fuse element terminating over the first terminal portion, wherein the bridge comprises an area of reduced width compared with a width of the balance of the fuse element.

5. The method of claim 4, wherein forming the fuse element with the bridge further comprises defining the bridge to have one of a rectangular shape or triangular shape in plan view adjacent to the one end of the fuse element terminating over the first terminal portion defined at least partially within the diffusion of the supporting semiconductor substrate.

6. A method of fabricating a fuse for an integrated circuit, the method comprising:
   providing a supporting surface with a support structure disposed over the supporting surface;
   forming a fuse extending between the supporting surface and an upper surface of the support structure, the fuse comprising a first terminal portion and a second terminal portion interconnected by a fuse element;
   wherein the first terminal portion resides at the supporting surface and the second terminal portion resides at the upper surface of the support structure, and wherein the interconnecting fuse element transitions between the first terminal portion and the second terminal portion disposed at different heights relative to the supporting surface; and
   wherein the supporting surface comprises a surface of a supporting semiconductor substrate, and wherein the support structure comprises a polysilicon stack extending above the supporting semiconductor substrate, and wherein forming the fuse comprises defining the first terminal portion at least partially within a diffusion in the supporting semiconductor substrate, and defining the second terminal portion at least partially in an exposed upper surface of the polysilicon stack, and wherein the first terminal portion, the second terminal portion and the fuse element comprise silicide.

7. The method of claim 6, wherein forming the fuse further comprises providing a sidewall spacer over at least one sidewall of the polysilicon stack, and forming the fuse element over the sidewall spacer, with a thickness of the fuse element over the sidewall spacer being less than a thickness of the first terminal portion and a thickness of the second terminal portion, and wherein forming the fuse element over the insulating sidewall spacer comprises forming a polysilicon sidewall spacer over the insulating sidewall spacer, and siliciding the polysilicon sidewall spacer.

8. The method of claim 7, wherein thickness of the fuse varies, and a thickness of the fuse element over the insulating sidewall spacer is less than a thickness of the first terminal portion disposed at least partially within the diffusion in the supporting semiconductor substrate, and is less than a thickness of the second terminal portion disposed at least partially in the exposed upper surface of the polysilicon stack.

9. The method of claim 6, further comprising after formation of the fuse, replacing the polysilicon stack with a dielectric material underneath the second terminal portion and adjacent to the fuse element extending between the first terminal portion and the second terminal portion.

10. A method of fabricating a fuse for an integrated circuit, the method comprising:
   providing a supporting surface with a support structure disposed over the supporting surface;
   forming a fuse extending between the supporting surface and an upper surface of the support structure, the fuse comprising a first terminal portion and a second terminal portion interconnected by a fuse element;
   wherein the first terminal portion resides at the supporting surface and the second terminal portion resides at the upper surface of the support structure, and wherein the interconnecting fuse element transitions between the first terminal portion and the second terminal portion disposed at different heights relative to the supporting surface; and
   wherein the support structure comprises a polysilicon stack, and wherein forming the fuse further comprises forming an insulating sidewall spacer over a sidewall of the polysilicon stack, providing a patterned polysilicon layer over the supporting surface, the insulating sidewall spacer and the polysilicon stack, and siliciding the patterned polysilicon layer to define the first terminal portion over the supporting surface, the second terminal portion over the polysilicon stack, and the fuse element interconnecting the first terminal portion and the second terminal portion and extending over the insulating sidewall spacer, wherein the fuse element includes a right angle bend where transitioning from the first terminal portion to the portion of the fuse element extending over the insulating sidewall spacer.

* * * * *